(12) United States Patent
Murata et al.

(10) Patent No.: US 7,479,651 B2
(45) Date of Patent: Jan. 20, 2009

(54) SEMICONDUCTOR DEVICE

(75) Inventors: Tomohiro Murata, Osaka (JP); Yutaka Hirose, Kyoto (JP); Tsuyoshi Tanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 423 days.

(21) Appl. No.: 11/293,144

(22) Filed: Dec. 5, 2005

(65) Prior Publication Data

US 2006/0118822 A1     Jun. 8, 2006

(30) Foreign Application Priority Data

Dec. 6, 2004   (JP)   ............... 2004-352447

(51) Int. Cl.
    *H01L 29/06*   (2006.01)
(52) U.S. Cl. ................... 257/15; 257/E29.072
(58) Field of Classification Search .......... 257/15
    See application file for complete search history.

(56) References Cited

U.S. PATENT DOCUMENTS

| 2005/0077538 A1* | 4/2005 | Heikman ............ 257/183 |
| 2005/0082568 A1* | 4/2005 | Hirose et al. ........... 257/192 |

FOREIGN PATENT DOCUMENTS

| JP | 09-172164 | 6/1997 |
| JP | 11-121472 | 4/1999 |
| JP | 2001-274375 | 10/2001 |
| JP | 2004-179452 | 6/2004 |
| JP | 2004-200188 | 7/2004 |
| JP | 2005-005657 | 1/2005 |
| JP | 2005-026671 | 1/2005 |

OTHER PUBLICATIONS

Mikoshiba; "Physics of Semiconductor"; c. 1991; Baifukan, Ltd.; c. 1991; pp. 108-111 and 360.

* cited by examiner

*Primary Examiner*—Jack Chen
*Assistant Examiner*—Matthew Reames
(74) *Attorney, Agent, or Firm*—McDermott Will & Emery LLP

(57) ABSTRACT

A semiconductor device comprises an active layer formed on a substrate, a superlattice layer formed on the active layer, and an ohmic electrode formed on the superlattice layer. In the superlattice layer, a first thin film and a second thin film are alternately laminated. The second thin film is made of a semiconductor which has polarization characteristics different from those of the first thin film and a band gap larger than that of the first thin film. An interface region between an upper surface of the first thin film and a lower surface of the second thin film or an interface region between a lower surface of the first thin film and an upper surface of the second thin film, is doped with an impurity.

19 Claims, 7 Drawing Sheets

Sum of thickness of first thin film and thickness of second film

SEMICONDUCTOR DEVICE

CROSS REFERENCE TO RELATED APPLICATIONS

This application claims priority under 35 U.S.C. 119 on Patent Application No. 2004-352447 filed in Japan on Dec. 6, 2004, the entire contents of which are hereby incorporated by reference. The entire contents of Patent Application No. 2005-343857 filed in Japan on Nov. 29, 2005 are also incorporated by reference.

BACKGROUND OF THE INVENTION

The present invention relates to a semiconductor device employing a III-V nitride semiconductor, and more particularly, to a transistor for use in a high frequency device.

III-V nitride semiconductors, i.e., gallium nitride (GaN), aluminum nitride (AlN), indium nitride (InN), and a mixed crystal material represented by a general formula $(In_xAl_{1-y})_yGa_{1-y}N$ where $0 \leq x \leq 1$ and $0 \leq y \leq 1$, have a wide band gap and a direct transition band structure. Not only applications of III-V nitride semiconductors to optical devices which utilize such physical features, but also applications thereof to electronic devices which utilize a large breakdown field and a large saturated electron velocity, have been studied. Particularly, a Hetero-junction Field Effect Transistor (hereinafter abbreviated as HFET) which employs 2 Dimensional Electron Gas (hereinafter abbreviated as 2DEG) occurring at an interface between $Al_xGa_{1-x}N$ and GaN which are epitaxially grown on a semi-insulating substrate, is being developed as a high power and high frequency device.

In order to improve element characteristics of these nitride semiconductor elements, it is necessary to reduce parasitic resistance components in the semiconductor element, such as contact resistance, channel resistance, and the like, to the extent possible. When current is transported by electrons, it is necessary to externally form an ohmic contact in a region in which the electrons are conducted.

As a conventional ohmic contact, for example, a multilayer metal thin film is used in which aluminum (Al), nickel (Ni), gold (Au), or the like is laminated on titanium (Ti; lowermost layer) formed on a nitride semiconductor layer of AlGaN or the like.

After a multilayer metal thin film having the Ti lowermost layer on the nitride semiconductor layer is formed, a heat treatment is performed at about 500° C. to about 900° C. so that Ti in the multilayer metal thin film and nitrogen (N) react with each other in the vicinity of an upper surface of the nitride semiconductor layer. N is extracted out by the reaction, so that holes are formed in the region in the vicinity of the upper surface of the nitride semiconductor layer. Therefore, the metallicity of the region in the vicinity of the upper surface of the nitride semiconductor layer increases. Also, the reaction of Ti and the nitride semiconductor generates Ga, Al, Ti, and a compound, such as TiN or the like. These products react with Al, Ni, Au, or the like in the multilayer metal thin film, thereby forming a more stable metal compound. As a result, a low-resistance ohmic contact is obtained.

By employing a contact layer made of GaN or the like which is doped to n type to the extent possible with respect to the nitride semiconductor layer in which an ohmic electrode is formed, the contact can be further reduced.

Alternatively, a method of improving electron concentration by providing a contact layer having a superlattice structure made of n type-doped AlGaN and GaN, has been proposed (see, for example, Japanese Unexamined Patent Publication No. 2005-26671, Japanese Unexamined Patent Publication No. H09-172164, and Japanese Unexamined Patent Publication No. H11-121472).

However, when the above-described conventional ohmic contact is a contact layer made of n type-doped GaN or the like, the lower limit of the contact resistance is determined by the activation rate of an impurity in the contact layer ($5\times10^{18}$ cm$^{-3}$ to $3\times10^{19}$ cm$^{-3}$). This is because the highest carrier concentration of the contact layer is determined by the impurity activation rate.

Also, when a superlattice made of n type-doped AlGaN and GaN is used as a contact layer, since an impurity is also doped into an interface between AlGaN and GaN where electrons are accumulated, scattering of electrons occurs due to the impurity, resulting in a reduction in electron mobility. As a result, the contact resistance and the parasitic resistance cannot be sufficiently reduced.

Also, when the n type ohmic electrode obtained by using this technique is used as a source electrode and a drain electrode of an HFET, negative piezoelectric charge occurs at an interface between an electron traveling layer of the HFET made of AlGaN or the like and the superlattice. Potential barrier for electrons at an interface between the high-concentration doped GaN layer of the superlattice and AlGaN of the electron traveling layer increases due to the negative piezoelectric charge, resulting in an increase in the contact resistance and the parasitic resistance.

SUMMARY OF THE INVENTION

The present invention is provided to solve the above-described conventional problems. An object of the present invention is to provide a semiconductor device in which an impurity activation rate and an electron mobility in a contact layer are high and which comprises an ohmic electrode having a small level of contact resistance and parasitic resistance.

In order to achieve the above-described object, the semiconductor device of the present invention comprises a superlattice layer in which only a portion of interfaces is doped.

The semiconductor of the present invention comprises a first nitride semiconductor layer formed on a substrate, a superlattice layer formed on the first nitride semiconductor layer and comprising first thin films and second thin films alternately laminated, the first thin film and the second thin film having different polarization characteristics and a band gap of the second thin film being larger than a band gap of the first thin film, and an electrode formed on the superlattice layer. A region doped with an impurity is formed in an interface region between an upper surface of the first thin film and a lower surface of the second thin film, or an interface region between a lower surface of the first thin film and an upper surface of the second thin film.

According to the semiconductor device of the present invention, as is different from when the entire superlattice layer is doped with an impurity, it is unlikely that scattering of electrons due to the impurity occurs. Therefore, the contact resistance and the parasitic resistance can be significantly reduced without a reduction in the electron mobility.

Preferably, in the semiconductor device of the present invention, negative polarization charge occurs in the interface region in which the doped region is formed. With such a structure, electrons can be generated with high concentration due to the polarization charge, and a reduction in the electron mobility caused by scattering of electrons due to the impurity can be prevented.

Preferably, the semiconductor device of the present invention further comprises a second nitride semiconductor layer doped with an impurity and formed between the superlattice layer and the electrode. With such a structure, it is possible to reduce potential barrier for electrons at an interface between the electrode and the superlattice layer. Also, it is possible to induce electrons at an interface between the second nitride semiconductor layer and the superlattice layer, thereby making it possible to prevent depletion in the vicinity of the interface. Therefore, the contact resistance can be further reduced.

Preferably, in the semiconductor device of the present invention, a value of a ratio of a thickness of the second thin film to a thickness of the first thin film is different between an upper portion and a lower portion of the superlattice layer. In this case, the thickness of the first thin film is larger than the thickness of the second thin film in the upper portion of the superlattice layer, and the thickness of the second thin film is larger than the thickness of the first thin film in the lower portion of the superlattice layer. With such a structure, it is possible to reduce potential barrier for electrons at the interface between the electrode and the superlattice layer, and reduce potential barrier for electrons at the interface between the superlattice layer and the first nitride semiconductor layer, thereby making it possible to further reduce the contact resistance.

Preferably, in the semiconductor device of the present invention, the thickness of the second thin film is larger than the thickness of the first thin film. In this case, a value of a ratio of the thickness of the second thin film to the thickness of the first thin film is preferably more than 1 and no more than 6.

Preferably, in the semiconductor device of the present invention, a value of a sum of the thickness of the first thin film and the thickness of the second thin film is 2 nm or more and 15 nm or less.

Preferably, in the semiconductor device of the present invention, the doped region has an impurity concentration of $1 \times 10^{17}$ cm$^{-3}$ or more and $1 \times 10^{21}$ cm$^{-3}$ or less.

Preferably, in the semiconductor device of the present invention, the doped region is a first delta-doped region. With such a structure, it is possible to reduce potential barrier for electrons at the interface between the superlattice layer and the first nitride semiconductor layer, making it possible to further reduce the contact resistance.

Preferably, in the semiconductor device of the present invention, a second delta-doped region is formed in a region in the first nitride semiconductor layer and at a distance of 0.1 nm or more and 1 μm or less from the interface between the first nitride semiconductor layer and the superlattice layer. With such a structure, it is possible to reduce potential barrier for electrons at the interface between the superlattice layer and the first nitride semiconductor layer, making it possible to further reduce the contact resistance.

Preferably, in the semiconductor device of the present invention, the first thin film is made of gallium nitride and the second thin film is made of aluminum nitride gallium.

Preferably, in the semiconductor device of the present invention, a plurality of semiconductor films are laminated in the first nitride semiconductor layer, and an uppermost one of the plurality of semiconductor films is made of aluminum nitride gallium. With such a structure, it is possible to reduce potential barrier for electrons at the interface between the superlattice layer and the first nitride semiconductor layer, making it possible to further reduce the contact resistance.

Preferably, the semiconductor device of the present invention further comprises a gate electrode formed on the first nitride semiconductor layer, the first nitride semiconductor layer comprises a channel layer and a barrier layer laminated together, and a band gap of the barrier layer is larger than a band gap of the channel layer, the superlattice layer is selectively formed on the first nitride semiconductor layer and on both sides of the gate electrode, and the electrode includes a source electrode formed on the superlattice layer on one side of the gate electrode and a drain electrode formed on the superlattice layer on the other side of the gate electrode.

In this case, preferably, the semiconductor device of the present invention further comprises a high-concentration impurity layer formed between each of the superlattice layers and the barrier layer and having the same composition as that of the barrier layer and a higher impurity concentration than that of the barrier layer. With such a structure, a recess structure of the gate electrode is easily formed.

In this case, preferably, each of the superlattice layers has an opening exposing the first nitride semiconductor layer, and the source electrode and the drain electrode are each formed contacting a side wall of the opening. Also, each of the superlattice layers may have a recess, the recess being an indentation of a portion of the superlattice layer, and the source electrode and the drain electrode may be each formed contacting a side wall of the recess.

DETAILED DESCRIPTION OF THE PREFFERED EMBODYMENTS

First Embodiment

Figure 1:
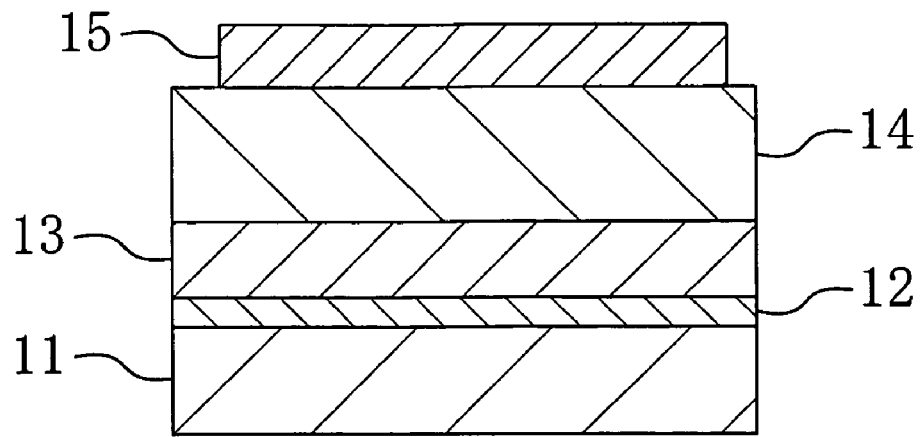
FIG. 1 is a cross-sectional view illustrating a semiconductor device according to a first embodiment of the present invention.

A first embodiment of the present invention will be described with reference to the accompanying drawings. FIG. 1 illustrates a cross-sectional view of a structure of a semiconductor device according to the first embodiment of the present invention. As illustrated in FIG. 1, the semiconductor device of the first embodiment comprises a gallium nitride (GaN) active layer 13 formed on a sapphire substrate 11 via an aluminum nitride (AlN) buffer layer 12, a superlattice layer 14 formed on the active layer 13 and functioning as a contact layer, and an ohmic electrode 15 formed on the superlattice layer 14.

Figure 2:
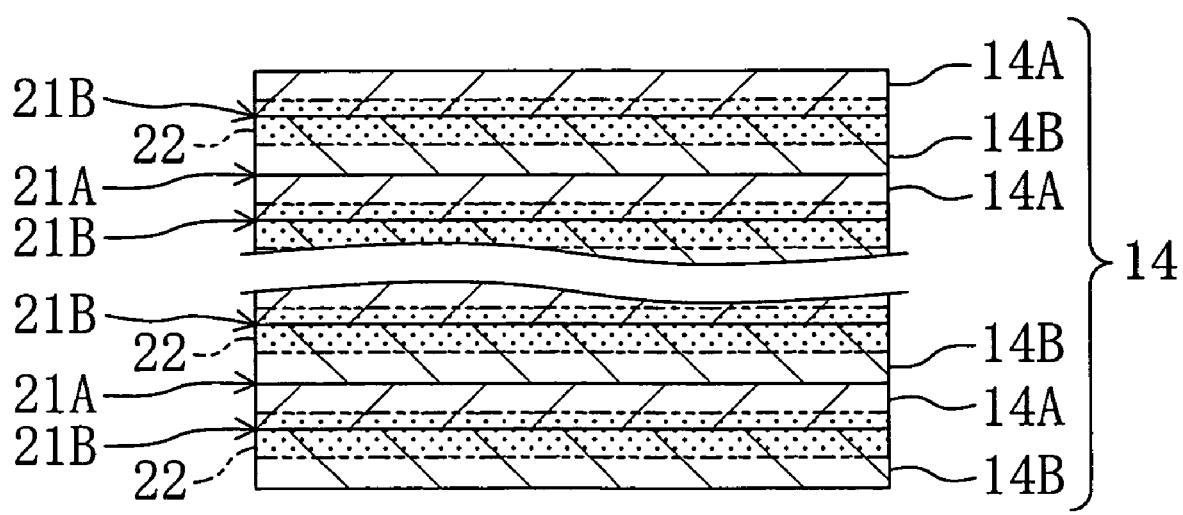
FIG. 2 is an enlarged cross-sectional view illustrating a superlattice layer portion of the semiconductor device of the first embodiment of the present invention.

The superlattice layer 14 is a multilayer film in which a first thin film 14A made of GaN and having a thickness of 2.3 nm and a second thin film 14B made of aluminum nitride gallium ($Al_xGa_{1-x}N$, $x=0.26$ in the first embodiment) and having a thickness of 4.7 nm are alternately laminated seven times as illustrated in FIG. 2. As illustrated in FIG. 2, in the superlattice layer 14, an n type-doped region 22 which is doped with Si (n type impurity) to a concentration of $1\times10^{19}$ $cm^{-3}$ is formed in an interface region between an upper surface of the first thin film 14A and a lower surface of the second thin film 14B.

Figure 3:
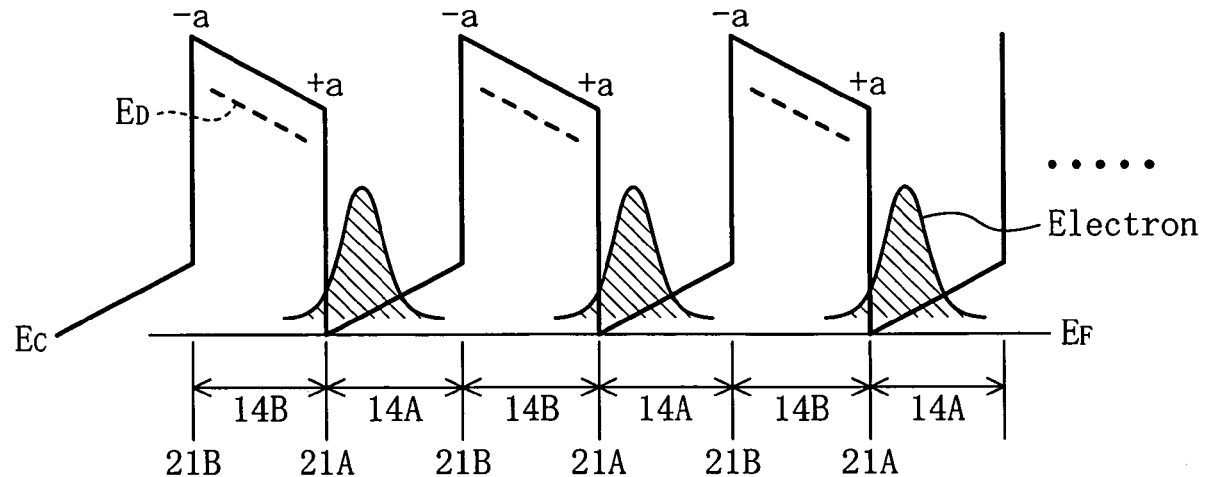
FIG. 3 is a diagram illustrating a state of a potential of the superlattice layer portion of the semiconductor device of the first embodiment of the present invention.

FIG. 3 illustrates a bottom of conduction band $E_C$ and a Fermi level $E_F$ in the superlattice layer 14. As illustrated in FIG. 3, polarization charge is generated at an interface between the first thin film 14A made of GaN and the second thin film 14B made of $Al_{0.26}Ga_{0.74}N$, which has a larger band gap than that of GaN, due to differences in spontaneous polarization and piezoelectric polarization between the first thin film 14A and the second thin film 14B. In the first embodiment, positive polarization charge +a occurs at an interface 21A between the upper surface of the first thin film 14A and the lower surface of the second thin film 14B, while negative polarization charge −a occurs at an interface 21B between the upper surface of the second thin film 14B and the lower surface of the first thin film 14A.

Inside the superlattice layer 14, the polarization charge induces a large amount of free charge consisting of electrons. The free charge thus generated is accumulated at the interface 21A between the upper surface of the first thin film 14A and the lower surface of the second thin film 14B. In the first embodiment, a region including the interface 21B, in which the negative polarization charge −a occurs, is doped with Si which is an n type impurity. The Si-doped region has a large energy difference between a donor level $E_D$ and the Fermi level $E_F$, and therefore, can have a particularly high donor activation rate. Therefore, the concentration of electrons accumulated in the interface 21A is $1\times10^{13}$ $cm^{-2}$. This corresponds to $5\times10^{19}$ $cm^{-3}$ if it is converted into a volume concentration, which exceeds $2\times10^{19}$ $cm^{-3}$ to $3\times10^{19}$ $cm^{-3}$ which is a limit concentration of electrons which can be ordinarily achieved by n type doping.

On the other hand, in the first embodiment, a region including the interface 21A, in which positive polarization charge +a occurs, is not doped. Therefore, electron mobility in a horizontal plane in the epitaxially grown layer is not reduced by scattering due to the impurity, so that an increase in electric resistance due to the impurity does not occur. Also, concerning movement of electrons in a direction perpendicular to the epitaxially grown layer, the second thin film 14B has a thin thickness of 4.7 nm, and in addition, a piezoelectric field occurring in the second thin film 14B causes an effective potential barrier to be thinner. Therefore, electrons which contribute to conduction in the first thin film 14A easily tunnel through the potential barrier of the second thin film 14B, so that an increase in electric resistance does not occur.

Hereinafter, a reason why a considerably high activation rate of electrons is obtained will be described. In general, taking into consideration electron statistics in an impurity semiconductor, a concentration $n_D$ of electrons occupying the donor level is represented by expression 1.

$$n_D = N_D f_D(E_D) = \frac{N_D}{1 + \frac{1}{2}\exp\left[(E_D - E_F)/k_B T\right]} \quad \text{(Expression 1)}$$

where $N_D$ indicates an impurity concentration, $f_D$ indicates an electron distribution function, $E_D$ indicates a donor level, $E_F$ indicates a Fermi level, $k_B$ indicates the Boltzmann constant, and T indicates an absolute temperature (see, Junichi Nishizawa, editor, Nobuo Mikoshiba, author, "Handotai no Butsuri (Semiconductor Physics) [revised version]", Baifukan, 1991, p. 109 to 110). According to expression 1, the concentration of a donor which is activated by releasing a free electron is represented by $N_D - n_D$, and therefore, an activation rate η of a donor impurity is represented by expression 2.

$$\eta = \frac{N_D - n_D}{N_D} \quad \text{(Expression 2)}$$
$$= 1 - f_D(E_D)$$
$$= \frac{1}{(1 + 2\exp\left[-(E_D - E_F)/k_B T\right])}$$

According to expression 2, as a difference between the donor level and the Fermi level increases, the second term in the denominator on the rightmost side asymptotically approaches 0, so that the activation rate approaches 1 (i.e., 100% activation). Therefore, by increasing the difference between the donor level and the Fermi level, a high activation rate can be obtained. This can also be applied to an acceptor impurity by changing the sign.

As illustrated in FIG. 3, in the interface 21B in which the negative polarization charge −a occurs, the difference between the donor level $E_D$ and the Fermi level $E_F$ is larger than in any other portions in the superlattice layer 14. By doping an impurity into a region including the interface 21B having the highest difference between the donor level $E_D$ and the Fermi level $E_F$, the activation rate of the donor impurity can be increased. As a result, the electron concentration can be increased, thereby making it possible to reduce the parasitic resistance.

Hereinafter, a method of producing the superlattice layer 14 in which only a region including the interface 21B is doped and a region including the interface 21A is not doped, will be described. The AlN buffer layer 12 having a thickness of 200 nm is formed on the sapphire substrate 11 in a chamber using a known technique, and thereafter, the GaN active layer 13 having a thickness of 3,000 nm is epitaxially grown.

Next, trimethylaluminum is supplied as an aluminum material, trimethylgallium is supplied as a gallium material, and ammonia is supplied as a nitrogen material, onto the active layer 13, thereby epitaxially growing $Al_{0.26}Ga_{0.74}N$.

After the epitaxial growth of $Al_{0.26}Ga_{0.74}N$, silane ($SiH_4$) is further supplied, thereby doping $Al_{0.26}Ga_{0.74}N$ with Si to a Si concentration of about $1\times10^{19}$ cm$^{-3}$. Thereafter, the supply of trimehylaluminum is stopped, and thereafter, the supply of $SiH_4$ is stopped, followed by growth of GaN.

Thereby, the second thin film 14B made of $Al_{0.26}Ga_{0.74}N$ and having a thickness of 4.7 nm and the first thin film 14A made of GaN and having a thickness of 2.3 nm are formed on the active layer 13. Next, the Al material is supplied again to start growth of $Al_{0.26}Ga_{0.74}N$. Growth of $Al_{0.26}Ga_{0.74}N$ and growth of GaN are alternately performed seven times, thereby obtaining the superlattice layer 14.

In the production method of the superlattice layer 14 of the first embodiment, Si is supplied partway during the growth of the second thin film 14B, and the supply of Si is stopped partway during the growth of the first thin film 14A. Therefore, a region in the vicinity of an interface at which the second thin film 14B is changed to the first thin film 14A is doped with Si, while a region in the vicinity of an interface at which the first thin film 14A is changed to the second thin film 14B is not doped.

When the thicknesses of the first thin film 14A and the second thin film 14B are either excessively large or excessively small, the effect of reducing the contact resistance is reduced. The reason is as follows. When the thickness of the first thin film 14A is excessively small, a region in which electrons are accumulated is narrowed, resulting in a reduction in electron concentration. Also, when the thickness of the second thin film 14B is excessively small, the volume of the n type $Al_{0.26}Ga_{0.74}N$ layer is reduced, resulting in a reduction in the amount of supplied electrons. On the other hand, when the thickness of the second thin film 14B is excessively large, electrons cannot tunnel through the second thin film 14B, resulting in an increase in resistance in a vertical direction of the superlattice layer 14.

Figure 4:
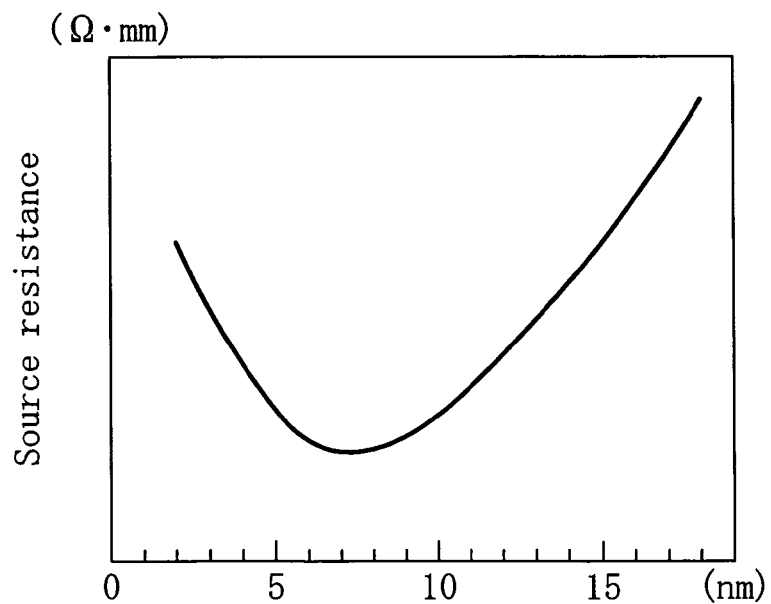
FIG. 4 is a graph illustrating a correlation between a structure of the superlattice layer and source resistance in the first embodiment of the present invention.

FIG. 4 illustrates a result of measurement of a relationship between a sum value of the thickness of the first thin film 14A and the thickness of the second thin film 14B, and the source resistance, in an HFET comprising the superlattice layer 14 of the first embodiment of the present invention. In FIG. 4, the horizontal axis indicates the sum value of the thickness of the first thin film 14A and the thickness of the second thin film 14B. Note that the ratio (14B/14A) of the thickness of the first thin film 14A and the thickness of the second thin film 14B is assumed to be 2. As illustrated in FIG. 4, the source resistance is smallest in the vicinity of where the sum thickness value is 7 nm. This is because, when the thicknesses of the first thin film 14A and the second thin film 14B are excessively small, it is no longer possible to supply and accumulate electrons, and when the thicknesses are excessively large, electrons cannot tunnel through potential barriers caused by the second thin film 14B. Therefore, the sum value of the thicknesses of the first thin film 14A and the second thin film 14B is preferably 2 nm or more and 15 nm or less.

Figure 5:
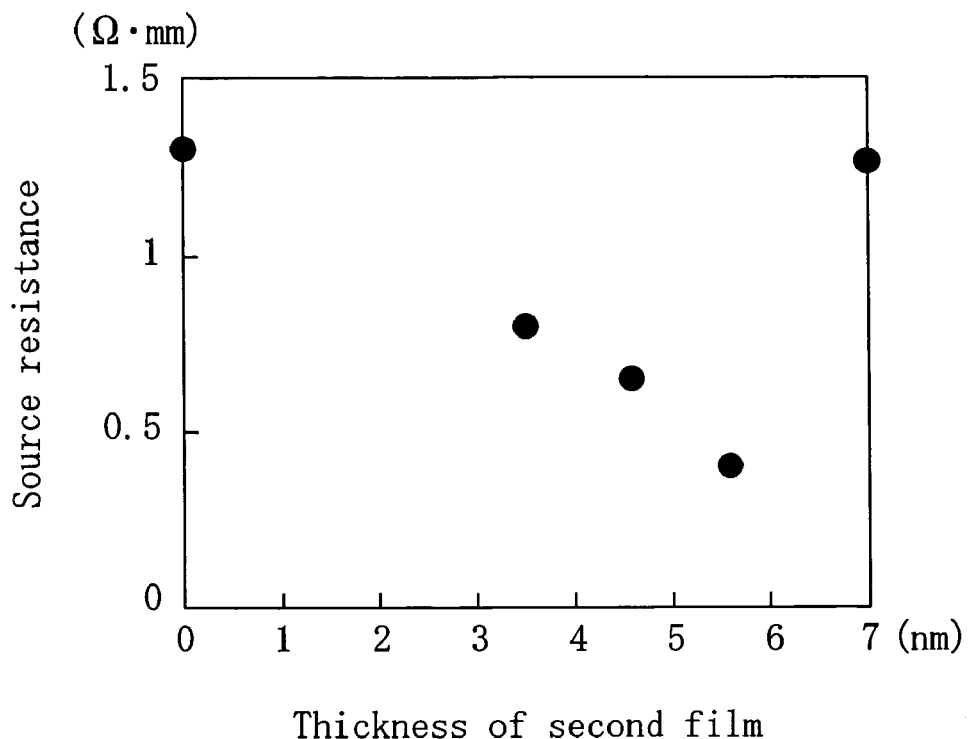
FIG. 5 is a graph illustrating a correlation between the structure of the superlattice layer and the source resistance in the first embodiment of the present invention.

FIG. 5 illustrates a result of measurement of a change in the source resistance when the thickness of the second thin film 14B is changed while the sum value of the thickness of the first thin film 14A and the thickness of the second thin film 14B is caused to remain constant, in an HFET comprising the superlattice layer 14 of the first embodiment. In FIG. 5, the sum value of the thickness of the first thin film 14A and the thickness of the second thin film 14B is fixed to 7 nm. As illustrated in FIG. 5, as the thickness of the second thin film 14B is increased, the value of the source resistance decreases. This is because, by increasing the thickness of the AlGaN layer, the n type AlGaN layer, which is an electron supplying layer, is increased, so that the electron concentration is increased. However, as the thickness of the second thin film 14B approaches 7 nm, the thickness of the first thin film 14A becomes excessively small, resulting in an increase in the value of the source resistance.

According to the above-described result, it is preferable that the thickness of the second thin film 14B be larger than the thickness of the first thin film 14A, and the value of the thickness ratio (14B/14A) be more than 1 and no more than 6. It is also preferable that the thickness of the first thin film 14A be 1 nm or more.

For example, when the first thin film 14A and the second thin film 14B are made of GaN and AlGaN, respectively, and the active layer 13 includes, for example, an AlGaN layer having the same Al molar ratio as or a different Al molar ratio from that of the second thin film 14B and are in contact with the superlattice layer 14, the effect of reducing the resistance is particularly remarkable.

Also, the thickness of the first thin film 14A and the thickness of the second thin film 14B may be individually changed in the superlattice layer 14. For example, if the thickness of the first thin film 14A immediately below the ohmic electrode 15 is increased, an effective band gap can be reduced at an upper portion of the superlattice layer 14. Thereby, it is possible to reduce the contact resistance between the ohmic electrode 15 and the superlattice layer 14. Also in this case, by causing the thickness of the second thin film 14B to be larger than the thickness of the first thin film 14A in a lower portion of the superlattice layer 14, potential barrier at an interface between the superlattice layer 14 and the active layer 13 can be reduced.

When the first thin film 14A is made of GaN, and an n type-doped GaN layer is provided between the superlattice layer 14 and the ohmic electrode 15, the effect of causing the thickness of the first thin film 14A to be larger than the thickness of the second thin film 14B in the upper portion of the superlattice layer 14 is significant.

In the first embodiment, the first thin film 14A and the second thin film 14B are made of AlGaN and GaN which have an epitaxilally grown pseudomorphic crystal structure, respectively, the piezoelectric polarization difference occurs between the first thin film 14A and the second thin film 14B. Even if relaxed crystal is employed, since the spontaneous polarization is present between the first thin film 14A and the second thin film 14B, free charge corresponding to the spontaneous polarization is induced at the interface between the first thin film 14A and the second thin film 14B. In this case, the amount of the charge is about $5\times10^{12}$ cm$^{-2}$, however, the same effect as that of the first embodiment of the present invention is obtained by reducing the thickness of each thin film to about half.

The compositions of the first thin film 14A and the second thin film 14B may be determined such that the first thin film 14A and the second thin film 14B have different polarization characteristics, and the band gap of the second thin film 14B is larger than the band gap of the first thin film 14A. For example, when the first thin film 14A is made of GaN and the second thin film 14B is made of $Al_xGa_{1-x}N$, it is preferable that the value of x be about 0.01 to 1, since the effect of confining electrons can be expected.

The present invention is not limited to the combination of GaN and AlGaN. Alternatively, it is possible to employ a combination of two compounds having different band gaps which are selected from compounds represented by a general formula $(In_xAl_{1-x})_yGa_{1-y}N$ where $0 \leq x \leq 1$ and $0 \leq y \leq 1$. Alternatively, it is possible to employ a combination of two compounds having different band gaps which are selected from compounds in which only piezoelectric polarization is dominant and which are represented by a general formula $Pb_xZ_y$-$Ti_zO_{2-x-y-z}$ where $0 \leq x \leq 1$, $0 \leq y \leq 1$, and $0 \leq z \leq 1$.

Note that, as an n type doping method applied to the superlattice layer 14, delta doping may be used in which the thickness of a doped layer can be reduced to the limit while the doping concentration is increased to the limit. By providing the delta-doped layer in the vicinity of an interface between an AlGaN layer and a GaN layer at which negative piezoelectric polarization charge occurs, a similar function and effect are obtained, thereby making it possible to reduce the contact resistance.

Figure 6:
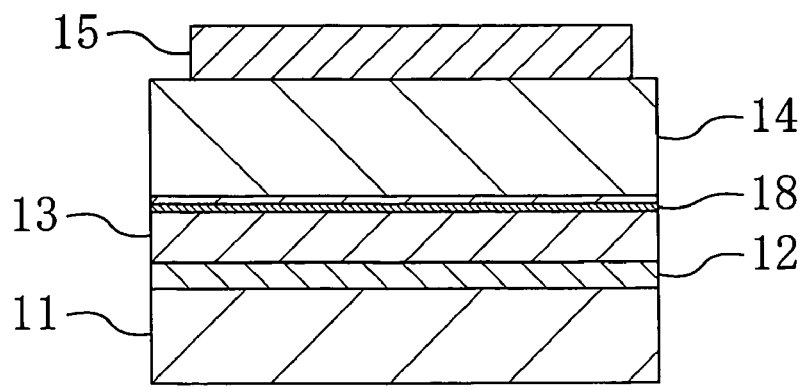
FIG. 6 is a cross-sectional view illustrating a semiconductor device according to another example of the semiconductor device of the first embodiment of the present invention.

Alternatively, as illustrated in FIG. 6, a delta-doped layer 18 may be provided below the interface between the superlattice layer 14 and the active layer 13. With such a structure, it is possible to reduce potential barrier for electrons at the interface between the superlattice layer 14 and the active layer 13, thereby making it possible to reduce the contact resistance. It is preferable that the delta-doped layer 18 be provided in the active layer 13 and at a distance of 0.1 nm or more and 1 μm or less from the interface between the superlattice layer 14 and the active layer 13.

In the first embodiment, the active layer 13 is described as a GaN layer, and may be made of other nitride semiconductors, or may be a multilayer composed of a plurality of semiconductor films. Also in the first embodiment, the lowermost layer of the superlattice layer 14 is the second thin film 14B and the uppermost layer thereof is the first thin film 14A for illustrative purposes. The order of the laminated layers may be reversed. In addition, both the uppermost layer and the lowermost layer may be the first thin film 14A or the second thin film 14B as long as the first thin films 14A and the second thin films 14B are alternately laminated.

In the first embodiment, since negative polarization charge occurs at the interface 21B between the upper surface of the second thin film 14B and the lower surface of the first thin film 14A, a region in the vicinity of the interface 21B is doped. However, in some structures of semiconductor devices, negative polarization charge occurs at the interface 21A between the upper surface of the first thin film 14A and the lower surface of the second thin film 14B. In this case, a region in the vicinity of the interface 21A is doped.

First Variation of the First Embodiment

Figure 7:
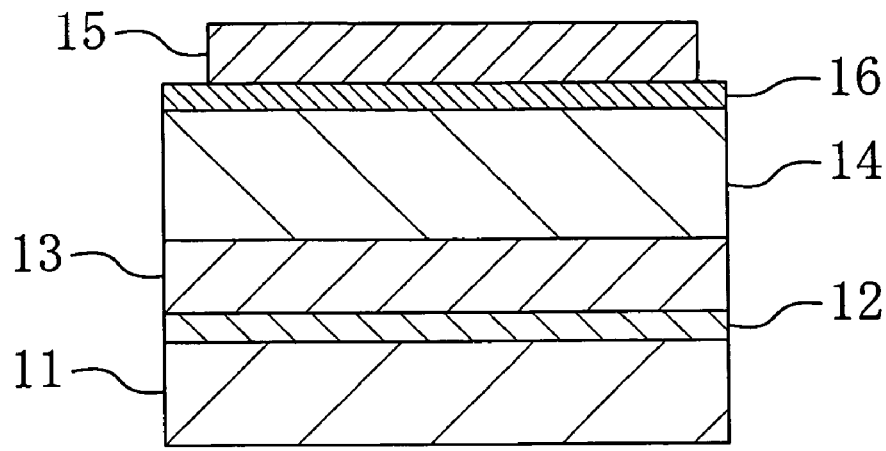
FIG. 7 is a cross-sectional view illustrating a semiconductor device according to a first variation of the first embodiment of the present invention.

Hereinafter, a first variation of the first embodiment of the present invention will be described with reference to the drawings. FIG. 7 illustrates a cross-sectional view of a structure of a semiconductor device according to the first variation of the first embodiment. In FIG. 7, the same components as those of FIG. 1 are indicated with the same reference numerals and will not be explained.

As illustrated in FIG. 7, the semiconductor device of the first variation of the first embodiment is characterized by further comprising an n type-doped layer 16 made of GaN and having a thickness of 20 nm, which is provided between the superlattice layer 14 and the ohmic electrode 15.

The n type-doped layer 16 is a high-concentration doped layer which is doped with Si to a concentration of $1 \times 10^{19}$ cm$^{-3}$. By providing the n type-doped layer 16, potential barrier at an interface between the ohmic electrode 15 and the superlattice layer 14 can be reduced, thereby making it possible to reduce the contact resistance.

In this case, since the n type-doped layer 16 is made of GaN, if the uppermost layer of the superlattice layer 14 is a thin film made of GaN, the contact resistance can be further reduced. In addition, if the thickness of the first thin film 14A is larger than the thickness of the second thin film 14B in an upper portion of the superlattice layer 14, a difference in a band gap at an interface between the n type-doped layer 16 and the superlattice layer 14 can be reduced. Thereby, the contact resistance can be further reduced. If the thickness of the second thin film 14B is larger than the thickness of the first thin film 14A in a lower portion of the superlattice layer 14, an increase in contact resistance between the superlattice layer 14 and the active layer 13 can be suppressed.

Second Variation of the First Embodiment

Figure 8:
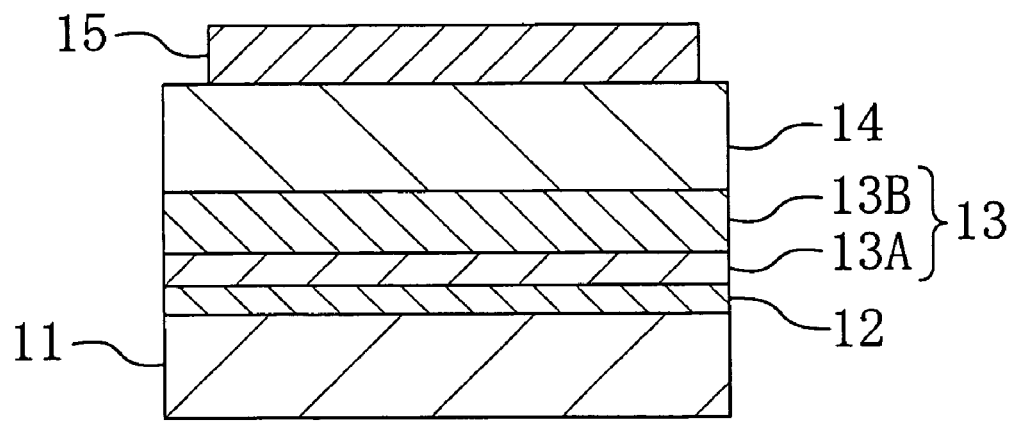
FIG. 8 is a cross-sectional view illustrating a semiconductor device according to a second variation of the first embodiment of the present invention.

Hereinafter, a second variation of the first embodiment of the present invention will be described with reference to the drawings. FIG. 8 illustrates a cross-sectional view of a structure of a semiconductor device according to the second variation of the first embodiment. In FIG. 8, the same components as those of FIG. 1 are indicated with the same reference numerals and will not be explained.

As illustrated in FIG. 8, the semiconductor device of the second variation of the first embodiment is characterized in that the active layer 13 is composed of a channel layer 13A made of GaN and a barrier layer 13B made of $Al_{0.26}Ga_{0.74}N$.

In the semiconductor device of the second variation, high-concentration and high-mobility 2DEG occurring at an interface between the channel layer 13A and the barrier layer 13B can be utilized, thereby making it possible to achieve a high-speed operation.

Third Variation of the First Embodiment

Figure 9:
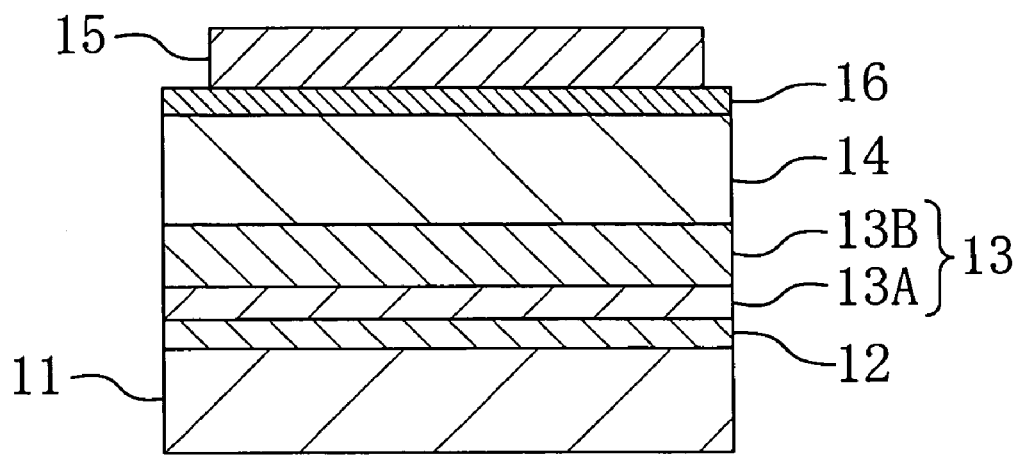
FIG. 9 is a cross-sectional view illustrating a semiconductor device according to a third variation of the first embodiment of the present invention.

Hereinafter, a third variation of the first embodiment of the present invention will be described with reference to the drawings. FIG. 9 illustrates a cross-sectional view of a structure of a semiconductor device according to the third variation of the first embodiment. In FIG. 9, the same components as those of FIG. 1 are indicated with the same reference numerals and will not be explained.

As illustrated in FIG. 9, the semiconductor device of the third variation of the first embodiment is characterized by further comprising an n type-doped layer 16 made of GaN between the superlattice layer 14 and the ohmic electrode 15, and in that the active layer 13 is composed of the channel layer 13A made of GaN and the barrier layer 13B made of $Al_{0.26}Ga_{0.74}N$.

In the first embodiment and the variations thereof, only an ohmic electrode portion of the semiconductor device is illustrated. By providing a Schottky electrode on the first nitride semiconductor layer, a Schottky barrier diode or an HFET can be formed. Also, it is possible to form a hetero-junction bipolar transistor in which the ohmic electrode is a base electrode.

Second Embodiment

Figure 10:
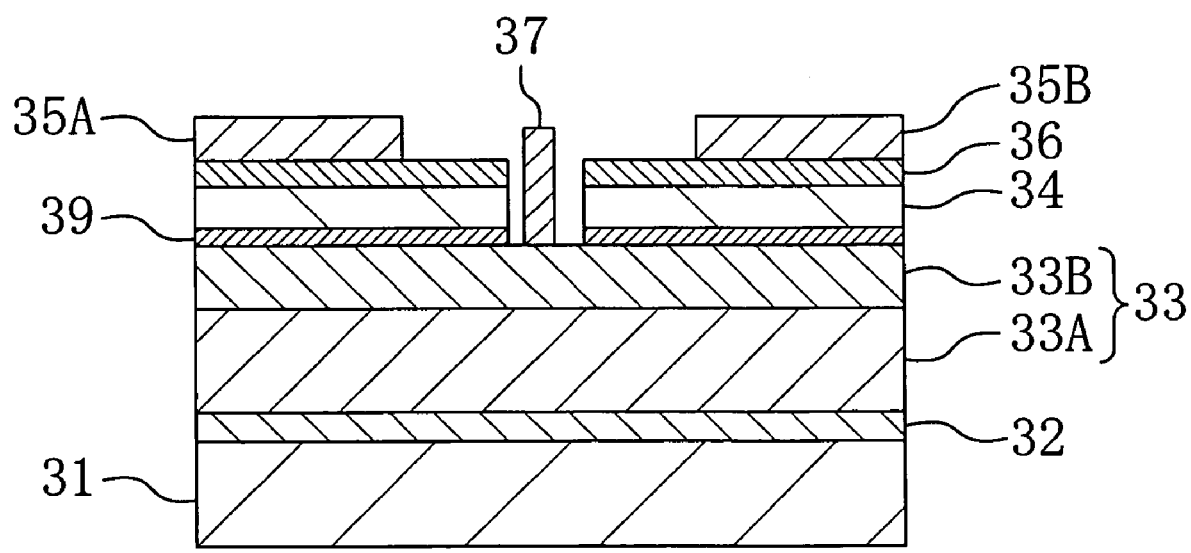
FIG. 10 is a cross-sectional view illustrating a semiconductor device according to a second embodiment of the present invention.

Hereinafter, a second embodiment of the present invention will be described with reference to the drawings. FIG. 10 illustrates a cross-sectional view of a structure of a semiconductor device according to the second embodiment of the present invention. As illustrated in FIG. 10, the semiconductor device of the second embodiment is an HFET. An active layer 33 is formed via an AlN buffer layer 32 on a sapphire substrate 31. The active layer 33 comprises a channel layer 33A made of GaN and having a thickness of 3 μm, and a barrier layer 33B made of $Al_{0.26}Ga_{0.74}N$ and having a thickness of 25 nm, which is formed on the channel layer 33A.

A gate electrode 37 made of palladium silicon alloy (PdSi), palladium (Pd), gold (Au), or the like is formed on the barrier layer 33B. A source electrode 35A and a drain electrode 35B made of, for example, a multilayer of titanium and aluminum are provided via a high-concentration n type-doped layer 39, a superlattice layer 34, and an n type-doped layer 36 on respective sides of the gate electrode 37.

The high-concentration n type-doped layer 39 is made of $Al_{0.26}Ga_{0.74}N$ and has a thickness of 20 nm, which is doped with Si to a concentration of $7\times10^{18}$ $cm^{-3}$.

The superlattice layer 14 is a multilayer film in which a first thin film 34A made of GaN and having a thickness of 2.4 nm and a second thin film 34B made of $Al_{0.26}Ga_{0.74}N$ and having a thickness of 4.6 nm are alternately laminated seven times. A region in the vicinity of an interface between an upper surface of the second thin film 34B and a lower surface of the first thin film 34A in the superlattice layer 14 is doped with Si (n type impurity) to a concentration of about $1\times10^{19}$ $cm^{-3}$.

The n type-doped layer 36 is made of GaN, has a thickness of 20 nm, and is doped with Si to a concentration of $1\times10^{19}$ $cm^{-3}$.

In the semiconductor device of the second embodiment, a region including an interface at which negative piezoelectric polarization charge occurs is doped with Si, which is an n type impurity. The Si-doped region has a large energy difference between the donor level and the Fermi level, thereby making it possible to particularly increase the donor activation rate. Thereby, high-concentration charge can be accumulated at an interface at which positive polarization charge occurs. Also, since a region in the vicinity of the interface at which positive polarization charge occurs is not doped, electron mobility in a plane horizontal to an epitaxial direction is not reduced by scattering due to the impurity, so that an increase in electric resistance due to the impurity does not occur. As a result, the contact resistance of the source electrode 35A and the drain electrode 35B can be significantly reduced.

Also, in the semiconductor device of the second embodiment, the channel layer 33A can be considered as a cap layer. The multilayer structure of $Al_{0.26}Ga_{0.74}N$ and GaN possessed by the superlattice layer 14 has an electron layer which can transport electrons in a direction parallel to a channel having a concentration far higher than in conventional technology. Therefore, as compared to conventional semiconductor devices, the parasitic resistance can be significantly reduced.

Figure 11A:
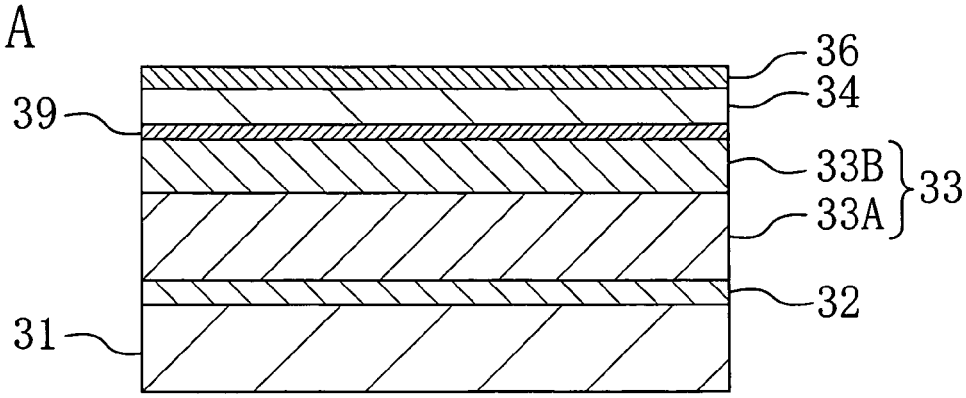
FIGS. 11A to 11C are cross-sectional views illustrating a method of producing the semiconductor device of the second embodiment of the present invention in order of process steps.
Figure 11B:
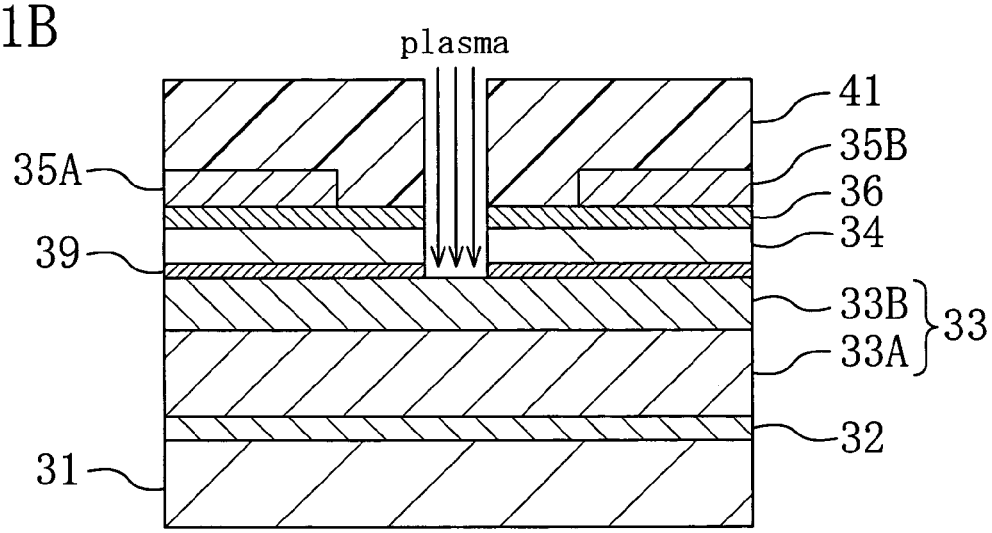
Figure 11C:
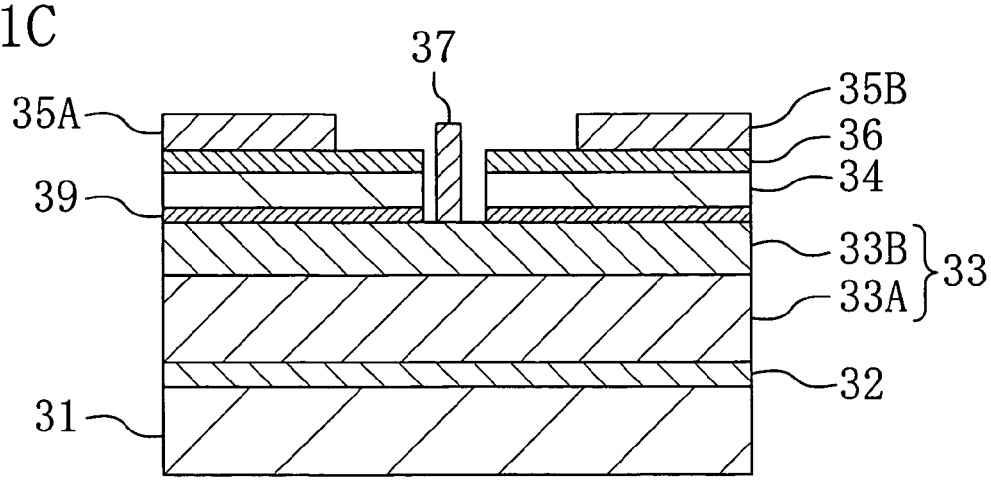

Hereinafter, a method of producing the semiconductor device of the second embodiment of the present invention will be described with reference to the drawings. FIGS. 11A to 11C illustrate the method of producing the semiconductor device of the second embodiment. As illustrated in FIG. 11A, the AlN buffer layer 32 is formed on the sapphire substrate 31 using a known technique. Thereafter, the GaN channel layer 33A having a thickness of 3 µm and the $Al_{0.26}Ga_{0.74}N$ barrier layer 33B having a thickness of 25 nm are successively formed. Next, 20 nm-thick $Al_{0.26}Ga_{0.74}N$ is deposited on the barrier layer 33B while doping silicon, thereby forming the high-concentration n type-doped layer 39.

Next, the second thin film 34B made of $Al_{0.26}Ga_{0.74}N$ and having a thickness of 4.7 nm and the first thin film 34A made of GaN and having a thickness of 2.4 nm are alternately expitaxially grown seven times on the high-concentration n type-doped layer 39, thereby forming the superlattice layer 34. In this case, a region in the vicinity of the interface between the upper surface of the second thin film 34B and the lower surface of the first thin film 34A is doped with Si. Following this, the n type-doped layer 36 having a thickness of 20 nm is formed using a Metal Organic Chemical Vapor Deposition (MOCVD) technique or the like.

Next, as illustrated in FIG. 11B, Ti and Al are successively deposited on the n type-doped layer 36, followed by a lift-off process, thereby forming the source electrode 35A and the drain electrode 35B. The source electrode 35A and the drain electrode 35B are subjected to a heat treatment for alloying.

Next, as illustrated in FIG. 11C, a mask 41 having an opening is formed using a resist, and a gate recess is formed using a technique, such as Inductively Coupled Plasma Reactive Ion Etching (ICP-RIE) or the like. Following this, the gate electrode 37 made of palladium silicon alloy (PdSi), palladium (Pd), gold (Au), or the like is formed.

In the case of the gate recess formation, the high-concentration n type-doped layer 39 formed in the lowermost layer of the superlattice layer 34 is etched with higher speed than that of the relatively low-concentration doped barrier layer 33B. Therefore, etching is automatically stopped at an interface between the high-concentration n type-doped layer 39 and the barrier layer 33B. As a result, the high-concentration n type-doped layer 39 does not remain in a region which a gate electrode is formed, so that the gate electrode having little leakage current can be formed with high reproducibility. In addition, the gate recess can be formed to have a uniform depth in a substrate surface, so that the in-plane uniformity of characteristics, such as a threshold voltage or the like, can be improved.

Although the n type-doped layer 36 is provided between the source electrode 35A and the drain electrode 35B, and the superlattice layer 34 in the semiconductor device of the second embodiment, the source electrode 35A and the drain electrode 35B may be formed directly on the superlattice layer 34. Alternatively, the high-concentration n type-doped layer 39 may not be provided under some etching conditions.

Variation of the Second Embodiment

Figure 12:
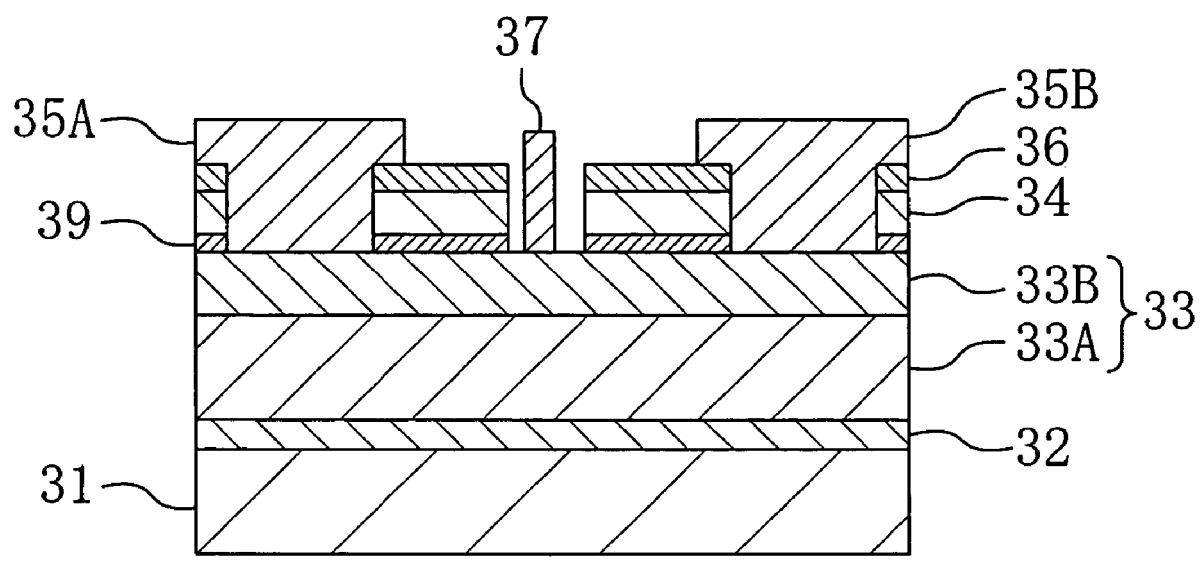
FIG. 12 is a cross-sectional view illustrating a semiconductor device according to a first variation of the second embodiment of the present invention.

Hereinafter, a variation of the second embodiment of the present invention will be described with reference to the drawings. FIG. 12 illustrates a cross-sectional view of a structure of a semiconductor device according to the variation of the second embodiment. In FIG. 12, the same components as those of FIG. 10 are indicated with the same reference numerals and will not be explained.

As illustrated in FIG. 12, in the semiconductor device of the variation of the second embodiment, the n type-doped layer 36, the superlattice layer 34, and the high-concentration n type-doped layer 39 have openings in which the source electrode 35A and the drain electrode 35B are buried. The source electrode 35A and the drain electrode 35B contact the superlattice layer 34 at side walls of the respective openings. Therefore, it is possible to utilize a high-concentration electron layer which can transport electrons in a direction parallel to a channel, which is possessed by the superlattice layer 34, thereby making it possible to reduce the parasitic resistance.

Although the source electrode 35A and the drain electrode 35B penetrate through the superlattice layer 34 and contact the barrier layer 33B in the above-described example, the source electrode 35A and the drain electrode 35B do not necessarily need to contact the barrier layer 33B, and a portion of the superlattice layer 34 may remain below the source electrode 35A and the drain electrode 35B.

Although the n type semiconductors have been described in the above-described embodiments and variations thereof, a p type semiconductor may be formed in a similar manner.

As described above, according to the present invention, a semiconductor device can achieve a high impurity activation rate and a high electron mobility in a contact layer, and comprises an ohmic electrode whose contact resistance and parasitic resistance are small. The semiconductor device of the present invention is useful as a semiconductor device employing a III-V nitride semiconductor, particularly a transistor for use in a high frequency circuit, or the like.

What is claimed is:

1. A semiconductor device comprising:
   a first nitride semiconductor layer;
   a superlattice layer formed on the first nitride semiconductor layer, and comprising first thin films and second thin films alternately laminated, the first thin film and the second thin film having different polarization characteristics, and a band gap of the second thin film being larger than a band gap of the first thin film; and
   an ohmic electrode formed on the superlattice layer,
   wherein a region doped with an impurity is formed in a first interface region between a lower surface of the first thin film and an upper surface of the second thin film, and
   an impurity concentration in the first interface region is higher than that in a second interface region between an upper surface of the first thin film and a lower surface of the second thin film.

2. The semiconductor device of claim 1, wherein negative polarization charge occurs in the first interface region in which the doped region is formed.

3. The semiconductor device of claim 1, further comprising:
   a second nitride semiconductor layer doped with an impurity and formed between the superlattice layer and the ohmic electrode.

4. The semiconductor device of claim 1, wherein a value of a ratio of a thickness of the second thin film to a thickness of the first thin film is different between an upper portion and a lower portion of the superlattice layer.

5. The semiconductor device of claim 4, wherein the thickness of the first thin film is larger than the thickness of the second thin film in the upper portion of the superlattice layer, and the thickness of the second thin film is larger than the thickness of the first thin film in the lower portion of the superlattice layer.

6. The semiconductor device of claim 1, wherein a thickness of the second thin film is larger than a thickness of the first thin film.

7. The semiconductor device of claim 6, wherein a value of a ratio of the thickness of the second thin film to the thickness of the first thin film is more than 1 and no more than 6.

8. The semiconductor device of claim 1, wherein a value of a sum of a thickness of the first thin film and a thickness of the second thin film is 2 nm or more and 15 nm or less.

9. The semiconductor device of claim 1, wherein the doped region has an impurity concentration of $1 \times 10^{17}$ cm$^{-3}$ or more and $1 \times 10^{21}$ cm$^{-3}$ or less.

10. The semiconductor device of claim 1, wherein the doped region is a first delta-doped region.

11. The semiconductor device of claim 1, wherein a second delta-doped region is formed in a region in the first nitride semiconductor layer and at a distance of 0.1 nm or more and 1 µm or less from an interface between the first nitride semiconductor layer and the superlattice layer.

12. The semiconductor device of claim 1, wherein the first thin film is made of gallium nitride and the second thin film is made of aluminum nitride gallium.

13. The semiconductor device of claim 12, wherein a plurality of semiconductor films are laminated in the first nitride semiconductor layer, and
   an uppermost one of the plurality of semiconductor films is made of aluminum nitride gallium.

14. The semiconductor device of claim 1, further comprising:
   a gate electrode formed on the first nitride semiconductor layer,
   wherein the first nitride semiconductor layer comprises a channel layer and a barrier layer laminated together, and a band gap of the barrier layer is larger than a band gap of the channel layer,
   the superlattice layer is selectively formed on the first nitride semiconductor layer and on both sides of the gate electrode, and
   the ohmic electrode includes a source electrode formed on the superlattice layer on one side of the gate electrode and a drain electrode formed on the superlattice layer on the other side of the gate electrode.

15. The semiconductor device of claim 14, further comprising:
   a high-concentration impurity layer formed between each of the superlattice layers and the barrier layer, and having the same composition as that of the barrier layer and a higher impurity concentration than that of the barrier layer.

16. The semiconductor device of claim 14, wherein each of the superlattice layers has an opening exposing the first nitride semiconductor layer, and
   the source electrode and the drain electrode are each formed contacting a side wall of the corresponding opening.

17. The semiconductor device of claim 14, wherein each of the superlattice layers has a recess, the recess being an indentation of a portion of the superlattice layer, and
   the source electrode and the drain electrode are each formed contacting a side wall of the corresponding recess.

18. The semiconductor device of claim 1, wherein the impurity is not doped in the second interface region.

19. The semiconductor device of claim 8, wherein electrons can tunnel through a potential barrier caused by the first thin film and the second thin film.

* * * * *